(12) United States Patent
Schossmann et al.

(10) Patent No.: US 8,970,094 B2
(45) Date of Patent: Mar. 3, 2015

(54) PIEZOELECTRIC CERAMIC MATERIAL, METHOD FOR THE PRODUCTION THEREOF, AND MULTILAYER COMPONENT

(75) Inventors: Michael Schossmann, Frauental (AT); Adalbert Feltz, Deutschlandsberg (AT)

(73) Assignee: EPCOS AG, Munich (DE)

( * ) Notice: Subject to any disclaimer, the term of this patent is extended or adjusted under 35 U.S.C. 154(b) by 344 days.

(21) Appl. No.: 13/514,274

(22) PCT Filed: Dec. 15, 2010

(86) PCT No.: PCT/EP2010/069789
§ 371 (c)(1),
(2), (4) Date: Aug. 13, 2012

(87) PCT Pub. No.: WO2011/073270
PCT Pub. Date: Jun. 23, 2011

(65) Prior Publication Data
US 2012/0306326 A1 Dec. 6, 2012

(30) Foreign Application Priority Data
Dec. 18, 2009 (DE) .......................... 10 2009 058 795

(51) Int. Cl.
*H01L 41/08* (2006.01)
*H01L 41/273* (2013.01)
(Continued)

(52) U.S. Cl.
CPC ............ *H01L 41/273* (2013.01); *C04B 35/493* (2013.01); *H01L 41/083* (2013.01);
(Continued)

(58) Field of Classification Search
USPC ................. 310/358, 311, 363, 364, 366, 368; 252/62.9 R, 62.9 PZ
See application file for complete search history.

(56) References Cited

U.S. PATENT DOCUMENTS 4,581,159 A * 4/1986 Hennings et al. ........ 252/62.3 R
6,080,328 A    6/2000 Horikawa
(Continued)

FOREIGN PATENT DOCUMENTS

DE      199 16 380 A1   10/1999
DE   10 2004 002 204 A1   8/2005
(Continued)

OTHER PUBLICATIONS

Chao, X., et al., "Effects of CuO addition on the electrical responses of the low-temperature sintered $Pb(Zr_{0.52}Ti_{0.48})O_3$—$Pb(Mg_{1/3}Nb_{2/3})O_3$—$Pb(Zn_{1/3}Nb_{2/3})O_3$ ceramics," Journal of Alloys and Compounds, No. 491, 2010, pp. 698-702.

(Continued)

*Primary Examiner* — Thomas Dougherty
*Assistant Examiner* — Karen B Addison
(74) *Attorney, Agent, or Firm* — Slater & Matsil, L.L.P.

(57) ABSTRACT

A piezoelectric ceramic material has the general formula: $P_{1-c-d}D_cZ_d(PbO)_w$ where: $0<c\leq0.025$; $0\leq d\leq0.05$; $0\leq w\leq0.05$; where P stands for a compound having the formula $[Pb_{1-v}Ag^I_v][(Zr_{1-y}Ti_y)_{1-u}Cu^{II}_u]O_3$, where $0.50\leq1-y\leq0.60$; $0<u\leq0.0495$; $0\leq v\leq0.02$, and D stands for a component of the general formula $[(M^1O)_{1-p}(M^2O)_p]_a[Nb_2O_5]_{1-a}$, where $M^1$ stands for $Ba_{1-t}Sr_t$, where $0\leq t\leq1$, $M^2$ stands for Sr and/or Ca, and $0<p<1$ and $\frac{2}{3}<a<1$ and Z stands for a compound of the general formula: $Pb(L_1R_r)O_3$ where L is present in the oxidation state II or III, and R is present in the oxidation state VI or V, and: $L^{II}$ is selected from among Fe, Mg, Co, Ni and Cu in combination with $R^{VI}$=W, where $1=\frac{1}{2}$ and $r=\frac{1}{2}$, or $L^{III}$ is selected from among Fe, Cr and Ga in combination with $R^V$=Nb, Ta or Sb, where $1=\frac{1}{2}$ and $r=\frac{1}{2}$, or $L^{III}$ is selected from among Fe, Cr and Ga in combination with $R^{VI}$=W, where $1=\frac{2}{3}$ and $r=\frac{1}{3}$.

15 Claims, 1 Drawing Sheet

(51) Int. Cl.
*C04B 35/493* (2006.01)
*H01L 41/083* (2006.01)
*H01L 41/187* (2006.01)

(52) U.S. Cl.
CPC ..... *H01L41/1876* (2013.01); *C04B 2235/3203* (2013.01); *C04B 2235/3206* (2013.01); *C04B 2235/3208* (2013.01); *C04B 2235/3213* (2013.01); *C04B 2235/3215* (2013.01); *C04B 2235/3241* (2013.01); *C04B 2235/3255* (2013.01); *C04B 2235/3258* (2013.01); *C04B 2235/3272* (2013.01); *C04B 2235/3275* (2013.01); *C04B 2235/3279* (2013.01); *C04B 2235/3281* (2013.01); *C04B 2235/3286* (2013.01); *C04B 2235/3289* (2013.01); *C04B 2235/3294* (2013.01); *C04B 2235/3296* (2013.01); *C04B 2235/652* (2013.01); *C04B 2235/768* (2013.01)
USPC ............ 310/358; 310/365; 310/363; 310/364

(56) References Cited

U.S. PATENT DOCUMENTS

| | | | |
|---|---|---|---|
| 6,230,378 B1 * | 5/2001 | Cramer et al. | 29/25.35 |
| 6,979,410 B2 * | 12/2005 | Sasaki | 501/134 |
| 2007/0158608 A1 * | 7/2007 | Feltz et al. | 252/62.9 PZ |
| 2007/0222341 A1 | 9/2007 | Iezumi et al. | |
| 2010/0066214 A1 | 3/2010 | Feltz et al. | |

FOREIGN PATENT DOCUMENTS

| | | |
|---|---|---|
| DE | 10 2007 012 915 A1 | 10/2007 |
| DE | 10 2007 010 239 A1 | 9/2008 |
| EP | 1 362 020 B1 | 3/2009 |
| JP | 5116500 A | 2/1976 |
| JP | 2002338349 A | 11/2002 |
| JP | 2007523821 A | 8/2007 |
| JP | 2007230839 A | 9/2007 |
| JP | 2008156201 A | 7/2008 |
| JP | 2010520137 A | 6/2010 |
| WO | WO 02/055450 A1 | 7/2002 |
| WO | WO 2006/110722 A1 | 10/2006 |

OTHER PUBLICATIONS

Chung, H., et al. "Piezoelectric and dielectric proprerties of $Pb(Zr,Ti)O_3$—$Pb(Mn,W,Sb,Nb)O_3$ with $Ag_2O$ addition," Journal of Vacuum Science & Technology, vol. 23, No. 4, Jul./Aug. 2005, 4 pages.

Feltz, A., et al., "Remarkable Strontium B-Site Occupancy in Ferroelectric $Pb(Zr_{1-x}Ti_x)O_3$ Solid Solutions Doped With Cryolite-Type Strontium Niobate," Journal of the American Ceramic Society, vol. 90, No. 12, 2007, pp. 3959-3967.

* cited by examiner

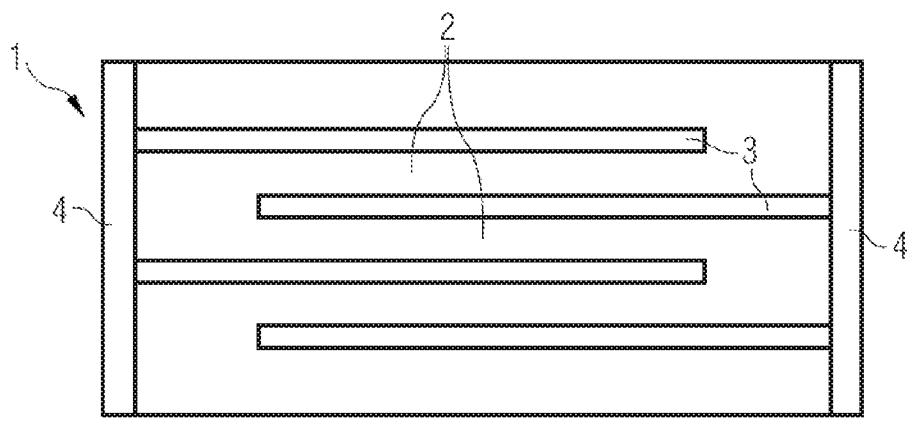

PIEZOELECTRIC CERAMIC MATERIAL, METHOD FOR THE PRODUCTION THEREOF, AND MULTILAYER COMPONENT

This patent application is a national phase filing under section 371 of PCT/EP2010/069789, filed Dec. 15, 2010 and published on Jun. 23, 2011 as WO 2011/073270, which claims the priority of German patent application 10 2009 058 795.0, filed Dec. 18, 2009, each of which is incorporated herein by reference in its entirety.

TECHNICAL FIELD

The invention relates to a piezoelectric ceramic material and a process for producing the piezoelectric ceramic material. Furthermore, the invention relates to a piezoelectric multilayer component which comprises such a piezoelectric ceramic material and also a production process for this piezoelectric multilayer component.

SUMMARY

A piezoelectric ceramic material is described. A piezoelectric ceramic material has the general formula $P_{1-c-d}D_cZ_d(PbO)_w$, where: $0<c\leq0.025$; $0\leq d\leq0.05$; $0\leq w\leq0.05$. P is a compound of the formula $[Pb_{1-v}Ag^I_v][(Zr_{1-y}Ti_y)_{1-u}Cu^{II}_u]O_3$, where $0.50\leq 1-y\leq 0.60$; $0<u\leq 0.0495$; $0\leq v\leq 0.02$. D is a component of the general formula $[(M^1O)_{1-p}(M^2O)_p]_a[Nb_2O_5]_{1-a}$. $M^1$ is $Ba_{1-t}Sr_t$, where $0\leq t\leq 1$, $M^2$ is Sr and/or Ca, and $0<p<1$ and $\frac{2}{3}<a<1$. Z is a compound of the general formula $Pb(L_lR_r)O_3$ where L is present in the oxidation state II or III and R is in the oxidation state VI or V. $L^{II}$ is selected from among Fe, Mg, Co, Ni and Cu in combination with $R^{VI}=W$, where $1=\frac{1}{2}$ and $r=\frac{1}{2}$, or L" is selected from among Fe, Cr and Ga in combination with $R^V=Nb$, Ta or Sb, where $1=\frac{1}{2}$ and $r=\frac{1}{2}$, or $L^{II}$ is selected from among Fe, Cr and Ga in combination with $R^{VI}=W$, where $1=\frac{2}{3}$ and $r=\frac{1}{3}$.

BRIEF DESCRIPTION OF THE DRAWINGS

For a more complete understanding of the present invention, and the advantages thereof, reference is now made to the following descriptions taken in conjunction with the accompanying drawing, in which:

The lone FIGURE shows a schematic cross section through a piezoelectric multilayer component.

DETAILED DESCRIPTION OF ILLUSTRATIVE EMBODIMENTS

A problem to be solved is to provide a piezoelectric ceramic material which has an optimized microstructure.

Such piezoelectric ceramic materials having an optimized microstructure are employed, for example, in the production of piezoceramic multilayer components having internal electrodes. Such piezoceramic multilayer components can be obtained, for example, by co-sintering of stacked green ceramic sheets with internal electrodes located in between.

The problem is solved by a piezoelectric ceramic material disclosed herein. Further embodiments of the piezoelectric ceramic material and a process for the production thereof and also a multilayer component comprising this ceramic material and production processes for the multilayer component are also described herein.

An embodiment of the invention provides a piezoelectric ceramic material of the general formula:

where:
$0<c\leq0.025$; $0\leq d\leq0.05$; $0\leq w\leq0.05$;
P is a compound of the formula $[Pb_{1-v}Ag^I_v][(Zr_{1-y}Ti_y)_{1-u}Cu^{II}_u]O_3$,
where
$0.50\leq 1-y\leq 0.60$; $0<u\leq 0.0495$; $0\leq v\leq 0.02$, and
D is a component of the general formula $[(M^1O)_{1-p}(M^2O)_p]_a[Nb_2O_5]_{1-a}$
where
$M^1$ is $Ba_{1-t}Sr_t$, where $0\leq t\leq 1$,
$M^2$ is Sr and/or Ca, and
$0<p<1$ and $\frac{2}{3}<a<1$, and
Z is a compound of the general formula $Pb(L_lR_r)O_3$
where
L is present in the oxidation state II or III and R is in the oxidation state VI or V, and:
$L^{II}$ is selected from among Fe, Mg, Co, Ni and Cu in combination with $R^{VI}=W$,
where
$1=\frac{1}{2}$ and $r=\frac{1}{2}$, or
$L^{III}$ is selected from among Fe, Cr and Ga in combination with $R^V=Nb$, Ta or Sb,
where
$1=\frac{1}{2}$ and $r=\frac{1}{2}$, or
$L^{III}$ is selected from among Fe, Cr and Ga in combination with $R^{VI}=W$,
where
$1=\frac{2}{3}$ and $r=\frac{1}{3}$.

Improved microstructure formation is achieved as a result of the presence of $Cu^{II}$ and optionally of $Ag^I$. This improves the piezoelectric properties of the ceramic material. A higher densification on sintering and an optimized grain growth are achieved, which leads to an improvement in the piezoelectric properties. The sintering process can also be carried out in a temperature range as low as from 900° C. to 950° C. This makes it possible to use the piezoelectric ceramic material for producing piezoelectric multilayer components which can have inexpensive internal electrodes having a, for example, low Pd content, e.g., $Pd_5Ag_{95}$. This can be sintered in an air atmosphere. The piezoelectric ceramic material can, due to the addition component D and the $Ag^+$ doping and $Cu^{2+}$ doping, achieve a high sintering activity under the conditions of cosintering with the internal electrodes. This is based to a critical extent on the formation of oxygen vacancies in the component P which occurs during the thermal process and leads to formation of a sufficiently dense ceramic microstructure with at the same time a sufficient average grain size. In this way, domains which are free of uncontrolled defects in the grain microstructure can be formed during the transition into the ferroelectric state below the Curie temperature. These then have sufficient mobility and high reversibility.

Thus, a high sintering activity which leads to the formation of a sufficiently dense ceramic microstructure with at the same time a sufficient average grain size can be achieved by the piezoelectric ceramic material under the conditions of co-sintering with the internal electrodes. Ferroelectric domains which are free of uncontrolled defects in the grain microstructure can be produced. These have sufficient mobility in an electric field and high reversibility.

In a further embodiment, the compound P serves as host lattice for the further components, as a result of which this can be described by the general formula of the perovskite lattice $ABO_3$.

Piezoelectric ceramic materials of the perovskite lattice type have particularly good piezoelectric properties.

In a further embodiment, u obeys: $0 < u \leq 0.015$.

Particularly good piezoelectric properties of the ceramic material were able to be achieved with a proportion of $Cu^{II}$ in the range indicated. Above a particular limit of the doping material $Cu^{II}$, incorporation into the perovskite crystal host lattice is no longer achieved. As a consequence, phase decomposition occurs and, for example, the oxygen vacancies are only incompletely occupied by incoming oxygen on cooling of the piezoelectric ceramic material. This results, owing to ion conductivities, in disadvantages in terms of the insulation resistance and the long-term stability.

In a further embodiment of the invention, v obeys: $0 < v \leq 0.010$.

A corresponding situation to that described above for $Cu^{II}$ applies to the dopant $Ag^{I}$ and its concentration. Here too, exceeding of an upper limits leads to the ions no longer being able to be incorporated in the perovskite crystal lattice and phase decomposition occurring.

As a result of doping both with $Cu^{II}$ and with $Ag^{I}$, synergistic effects can occur in respect of grain growth and densification on sintering. A further increase in the oxygen vacancy concentration during the sintering process can be achieved.

In a further embodiment of the invention, v obeys: $v=0$.

The addition of $Cu^{II}$ even without the additional addition of $Ag^{I}$ enables the formation of oxygen vacancies during the sintering process to be achieved. This formation of oxygen vacancies optimizes grain growth and leads to a densification on sintering which gives an advantageous microstructure. This in turn results in an improvement in the piezoelectric properties.

In a further embodiment of the invention, $t=1$ and $M^2$ is Sr.

The component D therefore comprises Sr as sole alkaline earth metal. Particularly good results were able to be achieved for piezoelectric ceramic materials in which the component D comprises the elements Sr and Nb. These can be, for example, $[Sr_4(Sr_{4/3}Nb_{8/3})O_{12}]$. Oxygen vacancies can also be formed in the component D during the production process, so as to form, for example, $[Sr_4(Sr_{5/3}Nb_{7/3})O_{11.5}V_{o;0.5}]$.

In a further embodiment of the invention, Z is $Ba(Cu_{0.5}W_{0.5})O_3$.

Particularly good results have been able to be achieved for these additional components. However, the addition of Cu via the additional component Z does not contribute to the formation of oxygen vacancies since these components in each case also introduce the counterions for charge compensation. Only the addition of CuO or $Cu_2O$ enables the desired formation of oxygen vacancies during the production process to be achieved.

In a further embodiment of the invention, L is selected from among: Fe, Mg, Co, Ni, Cr, Li and combinations thereof.

In addition to the piezoelectric ceramic material, a piezoelectric multilayer component which comprises one of the above-described ceramic materials is disclosed.

In one embodiment, the piezoelectric multilayer component comprises internal electrodes comprising at least one element selected from among: Ag, Pd, Cu and also ceramic layers comprising a ceramic material as described above.

Owing to the very good microstructure of the piezoelectric ceramic material and the associated improved piezoelectric properties, it is possible to make piezoelectric multilayer components which in turn have improved piezoelectric properties. These can have, for example, Ag, Ag/Pd or Cu internal electrodes.

The piezoelectric multilayer component can, for example, be produced by co-sintering of the ceramic layers with the internal electrodes. Here, it is possible to employ, for example, inexpensive internal electrodes having a low Pd content, for example $Pd_5Ag_{95}$, since the piezoelectric ceramic material has very good piezoelectric properties at a sintering temperature of as low as from 900° C. to 950° C. Costs can in each case be saved both by the lowering of the Pd content in the internal electrodes and by the reduced sintering temperature.

In addition to the piezoelectric ceramic material, a process for producing it is also claimed.

In a variant of the process for producing a piezoelectric ceramic material as described above, the process comprises the process steps: provision of the starting materials as process step A), comminution and mixing of the starting materials from A) so as to form a mixture as process step B), formation of green sheets from the mixture from B) as process step C) and sintering of the green sheets from C) as process step D).

The inventors have recognized that formation of oxygen vacancies occurs as a result of the addition of $Cu_2O$ or CuO and optionally additionally of $Ag_2O$. Furthermore, they have established that these oxygen vacancies promote grain growth and densification on sintering to give an advantageous microstructure. The doping with $Cu^{II}$ and $Ag^{I}$ has to be carried out with a particular concentration since above this concentration the isomorphous incorporation into the perovskite mixed crystal host lattice no longer occurs, resulting in phase decomposition. If such phase decomposition occurs, the oxygen vacancies can only be replaced incompletely by incoming oxygen during cooling, resulting in disadvantages in the insulation resistance and in the long-term stability due to ion conductivity.

The concentration of vacancies has a strong influence on the volume diffusion during the sintering process. The volume diffusion is in turn a prerequisite for the desired densification on sintering to be achieved during the sintering process.

The inventors have thus found a way of producing a piezoelectric ceramic material which in the finished state has no oxygen vacancies but such vacancies are present in the ceramic material during the sintering process, as a result of which increased volume diffusion can occur in the material and an increased densification on sintering and improved grain growth can thus be achieved. During cooling by means of air, the oxygen vacancies are filled by incoming oxygen toward the end of the production process. The oxygen sites can here act as electron trap (acceptor). The insulation resistance is significantly increased thereby. If oxygen vacancies were to remain in the finished piezoelectric ceramic material, the long-term stability of the ceramic would not be ensured due to oxygen ion conductivity.

In process step A), the starting materials can consist of the individual elements which can be provided as oxides or salts, but it is also possible to provide precursors. The precursors can be, for example, the components P, D and optionally Z which have been produced in upstream processes.

The starting materials are provided in the appropriate molar ratio depending on the desired piezoelectric ceramic material in process step A).

In a further variant of the process, the Cu from CuO and/or $Cu_2O$ is incorporated as $Cu^{II}$ into the ceramic material during sintering.

The use of CuO and/or $Cu_2O$ avoids introduction of a further constituent/element which could compensate the charge of the Cu into the piezoelectric ceramic material in addition to the Cu. Avoidance of charge compensation is an important prerequisite for the formation of oxygen vacancies.

The formation of oxygen vacancies can thus not be achieved by means of compounds as are, for example, available for selection as component Z, even when Cu is selected as L.

In a further variant of the process, oxygen vacancies are formed in the ceramic material by incorporation of $Cu^{II}$ into the ceramic material, so that an intermediate having the general formula: $Pb[(Zr_{1-y}Ti_y)_{1-u}Cu^{II}_u]O_{3-u}V_{O;u}$, where $V_O$ is an oxygen vacancy and: $0<u\leq0.0495$, is formed in the process.

In a further variant of the process, $Ag_2O$ is used as further starting material and the Ag is incorporated as $Ag^I$ into the ceramic material during sintering, so that an intermediate having the general formula: $[Pb_{1-v}Ag^I_v][(Zr_{1-y}Ti_y)_{1-u}Cu^{II}_u]O_{3-u+0.5v}V_{O;u-0.5v}$, where: $0<v\leq0.02$, is formed in the process.

In a further variant of the process, the oxygen vacancies are filled by oxygen from the air during cooling after sintering.

The oxygen vacancies can thus be filled directly with the oxygen from the air. There is therefore no need for any internal, i.e., present in the ceramic material, oxygen source.

In a further variant of the process, the volume diffusion during the sintering process is increased by the oxygen vacancies.

Good volume diffusion is a prerequisite for achievement of a good densification on sintering during the sintering process.

A variant of the invention is illustrated below with the aid of a FIGURE, which shows a schematic cross section through a piezoelectric multilayer component.

The FIGURE shows a schematic cross section of a piezoelectric multilayer component 1 which comprises ceramic layers 2 comprising a piezoelectric ceramic material as described above. The piezoelectric multilayer component 1 further comprises internal electrodes 3 which are arranged alternately between the ceramic layers 2. The internal electrodes 3 are in each case alternately joined in an electrically conductive manner to an outer electrode 4.

Such a piezoelectric multilayer component 1 can be produced, for example, by one of the above-described production processes. It is possible to use, for example, $Pd_5Ag_{95}$ for the internal electrodes 3.

Such a piezoelectric multilayer component 1 can be used, for example, in the automobile industry for controlling the introduction of fuel in internal combustion engines. The invention is not restricted by the description of the illustrated embodiments. Rather, the invention encompasses each new feature and any combination of features which, in particular, comprises any combination of features in the claims, even if this feature or this combination is itself not explicitly indicated in the claims or illustrated embodiments.

The invention claimed is:

1. A piezoelectric ceramic material of the general formula:

$$P_{1-c-d}D_cZ_d(PbO)_w$$

where:
$0<c\leq0.025$; $0\leq d\leq0.05$; $0\leq w\leq0.05$;
wherein P is a compound of the formula $[Pb_{1-v}Ag^I_v][(Zr_{1-y}Ti_y)_{1-u}Cu^{II}_u]O_3$, where $0.50\leq1-y\leq0.60$; $0<u\leq0.0495$; $0\leq v\leq0.02$, and
D is a component of the general formula $$[(M^1O)_{1-p}(M^2O)_p]_a[Nb_2O_5]_{1-a}$$

where
$M^1$ is $Ba_{1-t}Sr_t$, where $0\leq t\leq1$,
$M^2$ is Sr and/or Ca, and
$0<p<1$ and $2/3<a<1$, and
Z is a compound of the general formula:

$$Pb(L_1R_r)O_3$$

where
L is present in the oxidation state II or III and R is in the oxidation state VI or V, and
$L^{II}$ is selected from among Fe, Mg, Co, Ni and Cu in combination with $R^{VI}=W$,
where
$l=1/2$ and $r=1/2$, or
$L^{III}$ is selected from among Fe, Cr and Ga in combination with $R^V=Nb$, Ta or Sb,
where
$l=1/2$ and $r=1/2$, or
$L^{III}$ is selected from among Fe, Cr and Ga in combination with $R^{VI}=W$, where $l=2/3$ and $r=1/3$.

2. The ceramic material according to claim 1, wherein the compound P serves as host lattice for the further components, and can be described by the general formula of the perovskite lattice $ABO_3$.

3. The ceramic material according to claim 1, wherein u obeys: $0<u\leq0.015$.

4. The ceramic material according to claim 1, wherein v obeys: $0<v\leq0.010$.

5. The ceramic material according to claim 1, wherein v obeys: $v=0$.

6. The ceramic material according to claim 1, wherein $t=1$ and $M^2$ is Sr.

7. The ceramic material according to claim 1, wherein Z is $Ba(Cu_{0.5}W_{0.5})O_3$.

8. The ceramic material according claim 1, wherein L comprises an element selected from the group consisting of Fe, Mg, Co, Ni, Cr, Li and combinations thereof.

9. A piezoelectric multilayer component comprising:
internal electrodes comprising at least one element selected from the group consisting of Ag, Pd, and Cu; and
a plurality of ceramic layers adjacent the internal electrodes, each ceramic layer comprising a ceramic material according to claim 1.

10. A process for producing a piezoelectric ceramic material, the process comprising comminuting and mixing a plurality of starting materials to form a mixture,
forming green sheets from the mixture, and
sintering the green sheets,
wherein the piezoelectric ceramic material comprises the general formula:

$$P_{1-c-d}D_cZ_d(PbO)_w$$

where: $0<c\leq0.025$; $0\leq d\leq0.05$; $0\leq w\leq0.05$;
wherein P is a compound of the formula $[Pb_{1-v}Ag^I_v][(Zr_{1-y}Ti_y)_{1-u}Cu^{II}_u]O_3$, where $0.50\leq1-y\leq0.60$; $0<u\leq0.0495$; $0\leq v\leq0.02$, and
D is a component of the general formula $$[(M^1O)_{1-p}(M^2O)_p]_a[Nb_2O_5]_{1-a}$$

where
$M^1$ is $Ba_{1-t}Sr_t$, where $0\leq t\leq1$,
$M^2$ is Sr and/or Ca, and
$0<p<1$ and $2/3<a<1$, and
Z is a compound of the general formula:

$$Pb(L_1R_r)O_3$$

where
L is present in the oxidation state II or III and R is in the oxidation state VI or V, and
$L^{III}$ is selected from among Fe, Mg, Co, Ni and Cu in combination with $R^{VI}=W$, where
- $l=\frac{1}{2}$ and $r=\frac{1}{2}$, or
- $L^{III}$ is selected from among Fe, Cr and Ga in combination with $R^V$=Nb, Ta or Sb, where
- $l=\frac{1}{2}$ and $r=\frac{1}{2}$, or
- $L^{III}$ is selected from among Fe, Cr and Ga in combination with $R^{VI}$=W, where $l=\frac{2}{3}$ and $r=\frac{1}{3}$.

11. The process according to claim 10, wherein the Cu from CuO and/or $Cu_2O$ is incorporated as $Cu^{II}$ into the ceramic material during sintering.

12. The process according to claim 11, wherein oxygen vacancies are formed in the ceramic material by incorporation of $Cu^{II}$ into the ceramic material, so that an intermediate having the general formula:

$$Pb[(Zr_{1-y}Ti_y)_{1-u}Cu^{II}_u]O_{3-u}V_{O;u},$$

where $V_O$ is an oxygen vacancy and: $0<u\leq0.0495$, is formed in the process.

13. The process according to claim 12, wherein $Ag_2O$ is used as further starting material and the Ag is incorporated as $Ag^I$ into the ceramic material during sintering, so that an intermediate having the general formula:

$$[Pb_{1-v}Ag^I_v][(Zr_{1-y}Ti_y)_{1-u}Cu^{II}_u]O_{3-u+0.5v}V_{O;u-0.5v},$$

where:
- $0<v\leq0.02$, is formed in the process.

14. The process according to claim 12, wherein the oxygen vacancies are filled by oxygen from air during cooling after sintering.

15. The process according to claim 12, wherein the volume diffusion during the sintering process is increased by the oxygen vacancies.

* * * * *

UNITED STATES PATENT AND TRADEMARK OFFICE
CERTIFICATE OF CORRECTION

PATENT NO.         : 8,970,094 B2                           Page 1 of 1
APPLICATION NO.    : 13/514274
DATED              : March 3, 2015
INVENTOR(S)        : Michael Schossmann et al.

It is certified that error appears in the above-identified patent and that said Letters Patent is hereby corrected as shown below:

In the claims

In Col. 6, lines 66-67, claim 10, delete "$L^{III}$ is selected from among Fe, Mg, Co, Ni and Cu in combination with $R^{VI}=W$," and insert --$L^{II}$ is selected from among Fe, Mg, Co, Ni and Cu in combination with $R^{VI}=W$,--.

Signed and Sealed this
First Day of December, 2015

Michelle K. Lee
*Director of the United States Patent and Trademark Office*